(12) United States Patent
Takahashi et al.

(10) Patent No.: US 8,035,983 B2
(45) Date of Patent: Oct. 11, 2011

(54) WIRING BOARD AND METHOD OF MANUFACTURING WIRING BOARD

(75) Inventors: Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 529 days.

(21) Appl. No.: 12/144,691

(22) Filed: Jun. 24, 2008

(65) Prior Publication Data

US 2009/0020317 A1 Jan. 22, 2009

Related U.S. Application Data

(60) Provisional application No. 60/950,220, filed on Jul. 17, 2007.

(51) Int. Cl.
*H05K 1/11* (2006.01)

(52) U.S. Cl. ........ 361/792; 361/795; 361/809; 361/729; 361/735; 174/262; 174/255; 174/256

(58) Field of Classification Search .................. 361/790, 361/792, 795, 809, 729, 735, 736, 742, 748, 361/749, 758, 784, 746, 750, 762, 807, 774, 361/728, 716; 174/262, 255, 256, 259, 250
See application file for complete search history.

(56) References Cited

U.S. PATENT DOCUMENTS

| | | | |
|---|---|---|---|
| 2005/0016764 A1* | 1/2005 | Echigo et al. ................ | 174/256 |
| 2006/0012030 A1* | 1/2006 | Ho et al. ........................ | 257/700 |
| 2006/0083895 A1 | 4/2006 | Ikeda | |
| 2006/0180344 A1 | 8/2006 | Ito et al. | |
| 2006/0202344 A1 | 9/2006 | Takada et al. | |
| 2006/0218782 A1* | 10/2006 | Tuominen et al. .............. | 29/840 |
| 2006/0273446 A1* | 12/2006 | Sato et al. ..................... | 257/700 |
| 2006/0281343 A1* | 12/2006 | Uchida et al. .................. | 439/67 |
| 2007/0126123 A1* | 6/2007 | Sawachi ........................ | 257/777 |
| 2009/0007425 A1* | 1/2009 | Shinada et al. ................ | 29/843 |

FOREIGN PATENT DOCUMENTS

| | | |
|---|---|---|
| JP | 5-152693 | 6/1993 |
| JP | 11-74651 | 3/1999 |
| JP | 11-172457 | 6/1999 |
| JP | 2000-13019 | 1/2000 |
| JP | 2002-64271 | 2/2002 |
| JP | 2005-79402 | 3/2005 |
| JP | 2005-236205 | 9/2005 |

(Continued)

OTHER PUBLICATIONS

U.S. Appl. No. 12/050,646, filed Mar. 18, 2008, Takahashi, et al.

(Continued)

*Primary Examiner* — Hoa C Nguyen
(74) *Attorney, Agent, or Firm* — Oblon, Spivak, McClelland, Maier & Neustadt, L.L.P.

(57) ABSTRACT

A wiring board and method of forming a wiring board. The wiring board includes a first substrate and a second substrate having a smaller mounting area than a mounting area of the first substrate. A base substrate is laminated between the first substrate and the second substrate such that the first substrate extends beyond at least one edge of the second substrate. At least one of the base substrate, the first substrate or the second substrate comprises pliable resin, and at least one other of the base substrate, the first substrate or the second substrate comprises an inorganic filler.

30 Claims, 16 Drawing Sheets

FOREIGN PATENT DOCUMENTS

| | | |
|---|---|---|
| JP | 2005-268505 | 9/2005 |
| JP | 2005-336287 | 12/2005 |
| JP | 2006-32830 | 2/2006 |
| JP | 2006-114741 | 4/2006 |
| JP | 2006-202891 | 8/2006 |

OTHER PUBLICATIONS

U.S. Appl. No. 12/050,771, filed Mar. 18, 2008, Takahashi, et al.
U.S. Appl. No. 12/146,032, filed Jun. 25, 2008, Takahashi, et al.
U.S. Appl. No. 12/146,279, filed Jun. 25, 2008, Takahashi, et al.

* cited by examiner

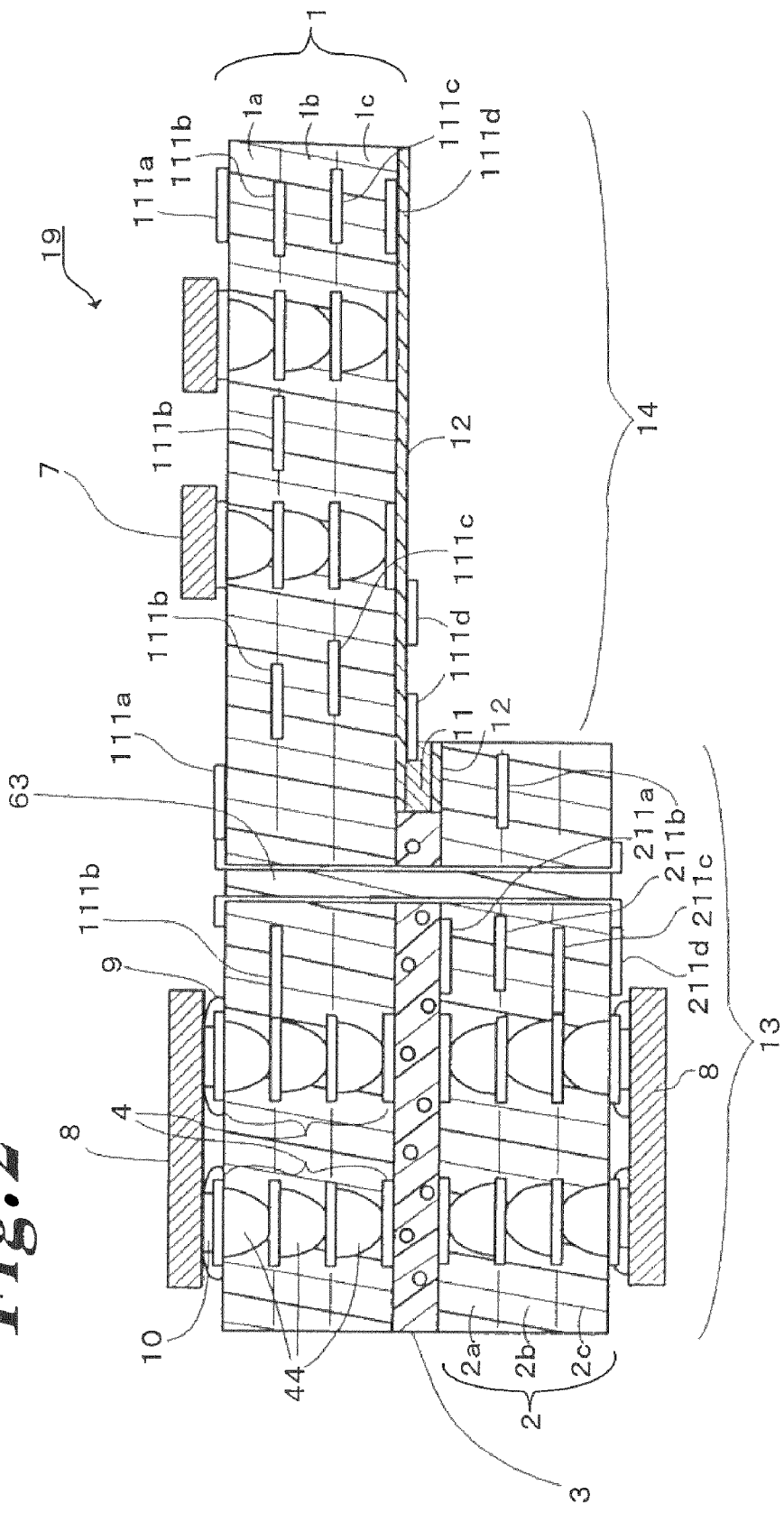

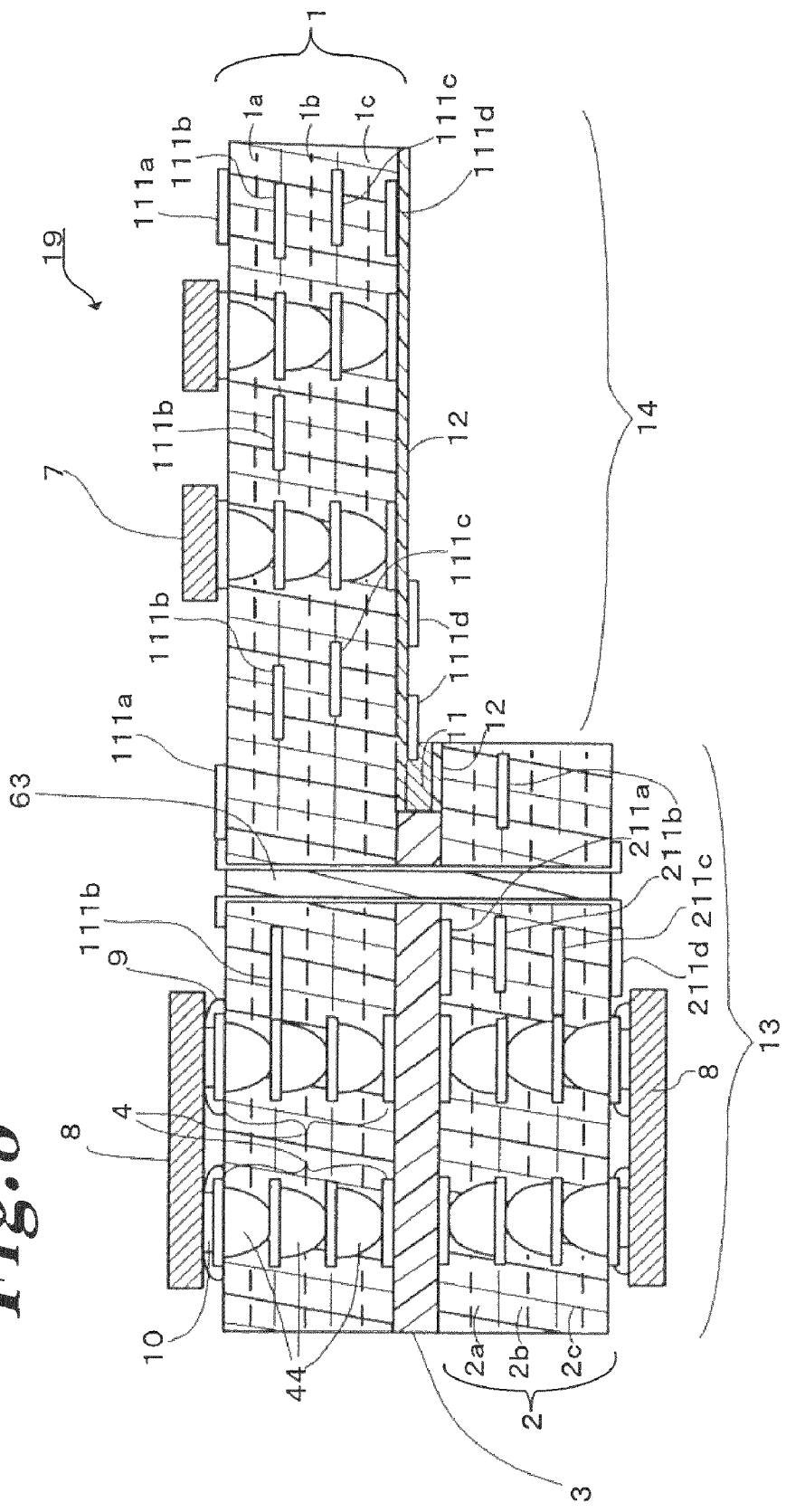

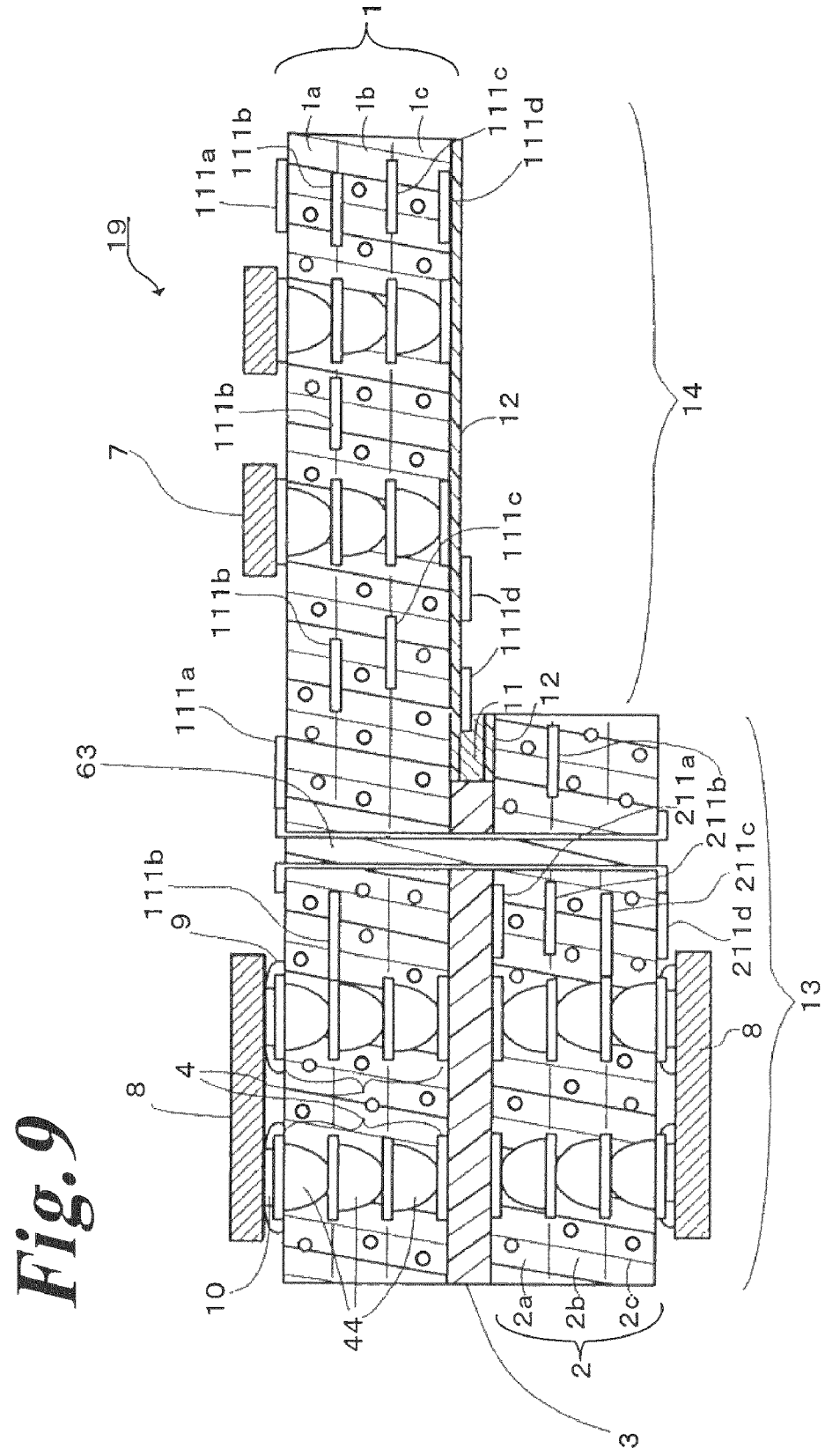

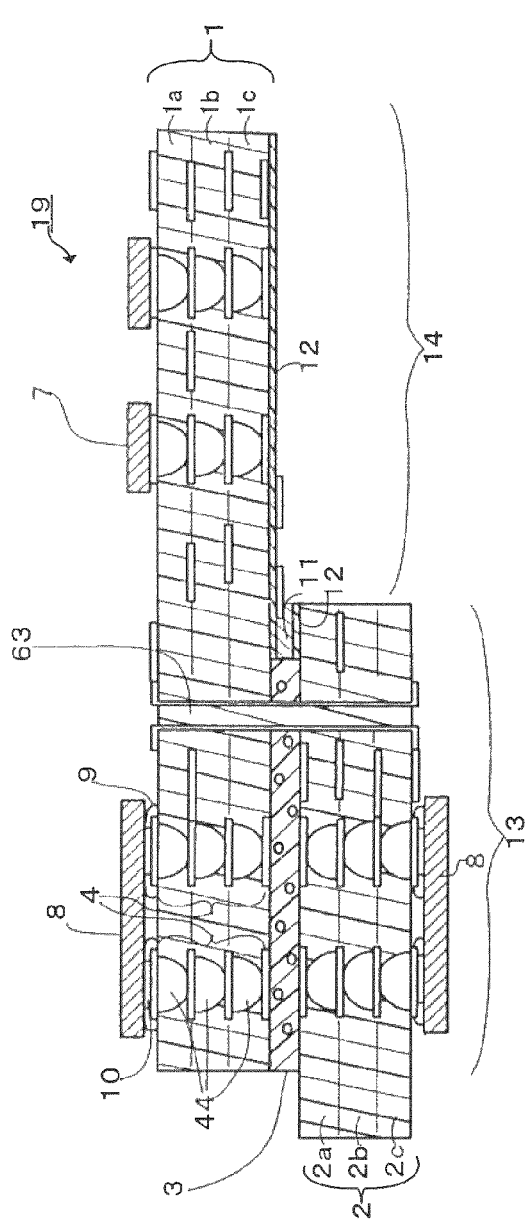
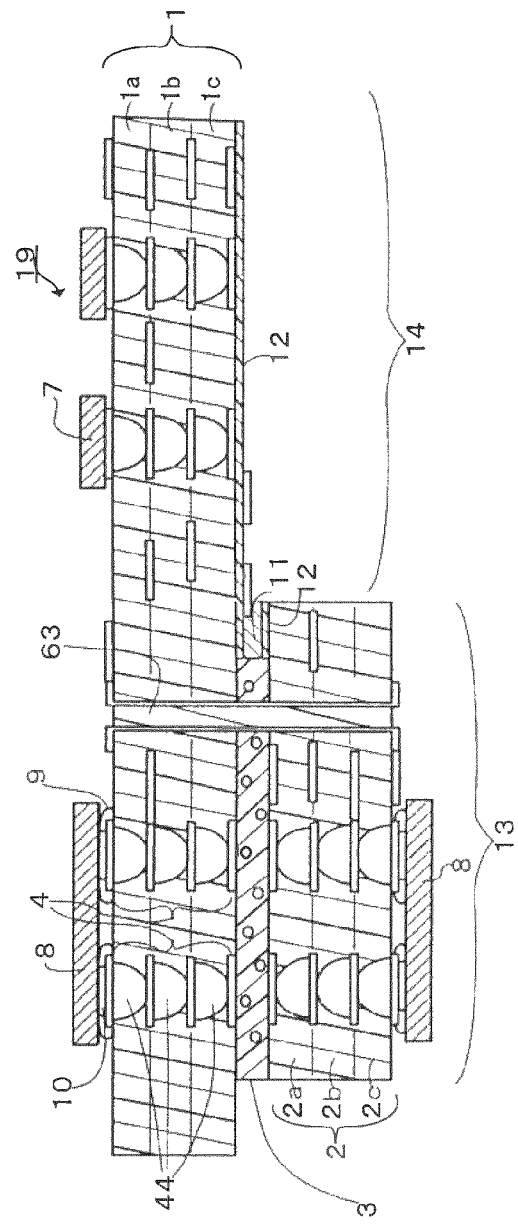
Fig. 12A
Fig. 12B

WIRING BOARD AND METHOD OF MANUFACTURING WIRING BOARD

RELATED APPLICATION

This application claims the benefit of U.S. Provisional Application Ser. No. 60/950,220 filed Jul. 17, 2007, the entire content of which is incorporated herein by reference.

TECHNICAL FIELD

The present invention, relates to a wiring board formed by combining at least two boards each having a different size mounting area, and a method of manufacturing such a wiring board.

DESCRIPTION OF RELATED ART

Japanese Laid-Open Patent Publication H5-152693 discloses technology to solve insufficient rigidity in a wiring board. The technology relates to a wiring board having a reinforced section formed by making an extended portion of a flexible substrate and folding the extended portion.

Further, during a step to form built-up layers in a partial section of a wiring board, the build-up resin for forming built-up resin layers may occasionally overflow. Thus, in Japanese Laid-Open Patent Publication 2006-32830, a wiring board using framed built-up resin films where the periphery of the built-up resins is surrounded by a framing member is disclosed. The entire content of each of H5-152693 and 2006-32830 is incorporated herein by reference.

SUMMARY OF THE INVENTION

One aspect of the invention includes a wiring board having a first substrate, and a second substrate having a smaller mounting area than a mounting area of the first substrate. A base substrate is laminated between the first substrate and the second substrate such that the first substrate extends beyond at least one edge of the second substrate. At least one of the base substrate, the first substrate or the second substrate comprises pliable resin, and at least one other of the base substrate, the first substrate or the second substrate comprises an inorganic filler.

Another aspect of the invention includes a method of manufacturing a wiring board, including forming a base substrate, and forming a first insulation layer on a first surface of the base substrate and a second insulating layer on a second surface of the base substrate opposing the first surface. The first insulating layer is cut in a first area and the second insulating layer is cut in a second area offset from the first area to form a first substrate laminated to a second substrate with the base layer interposed therebetween, the second substrate having a smaller mounting area than that of the first substrate such that the first substrate extends beyond an edge of the second substrate. At least one of the base substrate, the first substrate or the second substrate is formed to include pliable resin, and at least one other of the base substrate, the first substrate or the second substrate is formed to include an inorganic filler.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional view illustrating a wiring board according to an embodiment of the present invention.

FIG. 8 is a cross-sectional view of a wiring board according to an embodiment of the present invention.

FIG. 9 is a cross-sectional view of a wiring board according to an embodiment of the present invention.

FIG. 12A is a cross-sectional view of a wiring board according to an embodiment of the present invention.

FIG. 12B is a cross-sectional view of a wiring board according to an embodiment of the present invention.

DETAILED DESCRIPTION OF EMBODIMENTS

In the following, an embodiment of a wiring board according to a specific example of the present invention is described with reference to the drawings.

Figure 1A:
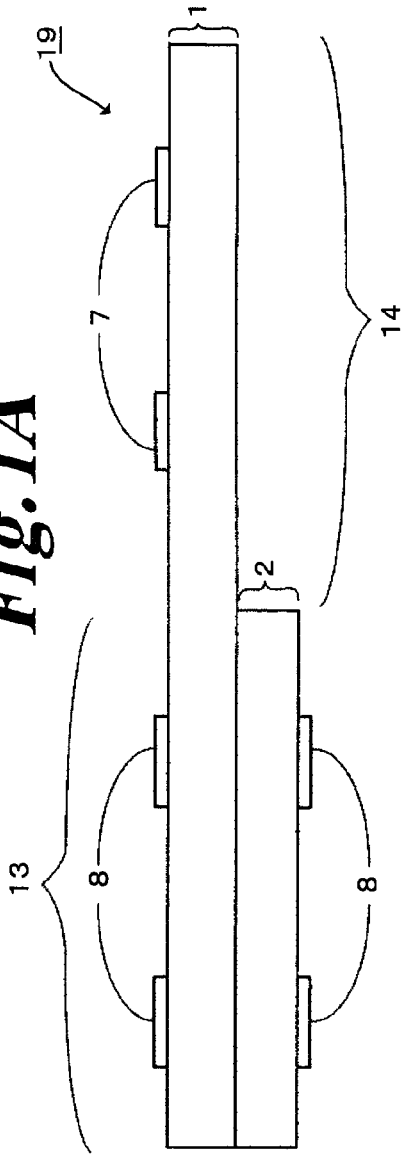
FIG. 1A is a side view illustrating a wiring board according to an embodiment of the present invention.

As shown in FIG. 1A, wiring board 19 according to a specific example of the present invention has a different thickness on one edge from that on the other edge. The number of layers in the section having a different thickness (thicker section) differs from the number of layers in the thinner section. Namely, wiring board 19 has thick multi-layer section 13 and relatively thin fewer-layer section 14. Multi-layer section 13 is formed by laminating two layers; first substrate 1 and second substrate 2. Fewer-layer section 14 has first substrate 1, which is extended from multi-layer section 13. Thus, as used herein, the term "multi-layer section" means two or more layers or boards, while the term "fewer layer section" means one or more layers or boards.

Figure 1B:
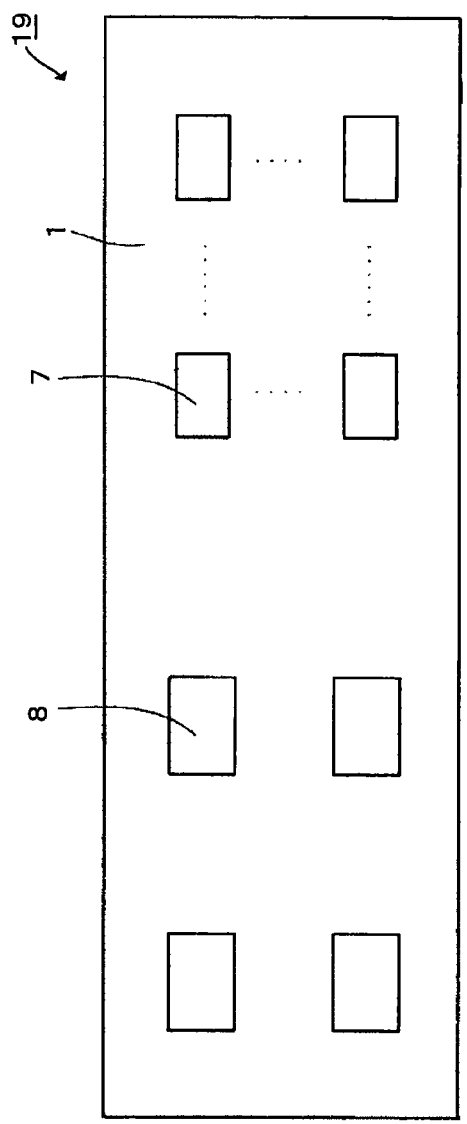
FIG. 1B is a plan view illustrating a wiring board according to an embodiment of the present invention.

As shown in FIGS. 1A and 1B, first substrate 1 and second substrate 2 have the same width and different lengths, and one end of first substrate 1 is aligned with one end of second substrate 2 such that another end of the first substrate extends beyond the second substrate. However, it is not necessary for any ends of the first and second substrates to be aligned, as will be discussed further below. In the embodiment of FIGS. 1A and 1B, the first substrate 1 and second substrate 2 are each formed with pliable base material mainly containing epoxy resin.

On the surfaces (mounting surfaces) of first substrate 1 and second substrate 2, connection pads to connect electronic components are formed; on the surfaces (mounting surfaces) and inner surfaces of first substrate 1 and second substrate 2, wiring patterns to structure electrical circuits are formed. On the mounting surfaces of first substrate 1 and second substrate 2, electronic components 7, 8 are arranged and connected to connection pads according to their requirements. Electronic components 7, 8 are connected with each other through connection pads and wiring patterns.

Wiring board 19 is placed, for example, in the casing of a cell phone device. Under such circumstance, electronic component 7 positioned in fewer-layer section 14 is structured, for example, with the keypad of a keyboard; and electronic component 8 positioned in multi-layer section 13 is structured with an electronic chip, IC module, functional components and others, for example. Also, in the step portion formed by multi-layer section 13 and fewer-layer section 14, for example, a thin-type battery is placed.

Next, a detailed structure of wiring board 19 having the above overall structure is described in reference to FIG. 2. As illustrated, first substrate 1 and second substrate 2 are laminated with base substrate 3 provided in between. One end (the left end as illustrated in the drawing) of base substrate 3 is made to be flush with first substrate 1 and second substrate 2. Thus, the base substrate 3 is laminated between the first substrate and the second substrate such that the first substrate 1 extends beyond an edge of the second substrate 2. Alternatively, only an almost middle region of the wiring board 19 can be a thick multilayer section while opposing ends of the wiring board are each a thinner fewer layer section. An example of the almost middle region is the area in FIG. 2 between one cross section line (not shown) through the edge of the second substrate which forms the step structure, and another cross section line (not shown) through an edge of components 8 which is closest to the through hole 63. Still alternatively, the first substrate 1 and second substrate 2 having the same width and different lengths can be arranged such that opposing ends of the first substrate 1 each extend beyond the second substrate 2 as shown in the examples in FIGS. 12A and 12B, which will be further discussed below.

However, it is not necessary to have any peripheral edges of the first and second substrate aligned. That is, the wiring board can have an entire peripheral region (for example, formed by the first substrate 1 alone or second substrate 2 alone) that is thinner than an interior non-peripheral region (for example, formed by the first and second substrates together). Thus, according to embodiments of the invention, at least a central portion of the wiring board is a thicker multi layer section, and at least a portion of the periphery of the wiring board is a thinner fewer layer section. As used herein "central portion" means a non-peripheral area of the wiring board having a thicker multilayer section, but does not mean the geometric center of the wiring board.

One or more of the base substrate the first substrate or the second substrate can include a pliable resin. In the embodiment of FIG. 2, base substrate 3 is made of resin containing inorganic filler. The resin containing inorganic filler is prepared by combining silica filler with glass-epoxy resin. For silica filler, fused silica ($SiO_2$) is used. Base substrate 3 is made 50-100 μm, preferably about 100 μm.

Base substrate 3 is formed to be shorter than second substrate 2, and between first substrate 1 and second substrate 2, groove (hereinafter referred to as "interlayer groove section") 11 is formed. Interlayer groove section 11 is an aperture. The groove may be filled with elastic material or viscous material such as silicone gel or silicone oil. When wiring board 19 receives an impact from being dropped, the groove aperture or silicone gel or silicone oil that is filled in the interior of the groove cushions the impact as a shock-absorbing layer. Therefore, by being structured in this way, tolerance to impact from being dropped may be improved.

First substrate 1 has a structure of laminated multiple insulation layers (1a, 1b, 1c). Each insulation layer is made of epoxy resin or the like with a thickness approximately 10 μm-60 μm. On the upper surface of insulation layer (1a), between epoxy-resin layers (1a) and (1b), between insulation layers (1b) and (1c) and on the lower surface of insulation layer (1c), wiring patterns (111a, 111b, 111c, 111d) are formed respectively. Each wiring pattern (111a, 111b, 111c, 111d) electrically connects required portions inside the circuit substrate.

Second substrate 2 also has a structure of laminated multiple insulation layers (2a, 2b, 2c) made of epoxy resin or the like with a thickness approximately 10 μm-60 μm. On the lower surface of insulation layer (2a), between epoxy-resin layers (2a) and (2b), between insulation layers (2b) and (2c) and on the upper surface of insulation layer (2c), wiring patterns (211a, 211b, 211c, 211d) are formed respectively. Each wiring pattern (211a, 211b, 211c, 211d) electrically connects required portions inside the circuit substrate.

On the exposed portion of the lower surface of first substrate 1 and the exposed portion of the upper surface of the second substrate, adhesion prevention layers 12 as a protective insulation layer are formed. At the step portion created when laminating first substrate 1 and second substrate 2, conductive pattern (111d) is formed. Also, to the right of conductive pattern (111d) formed at the step portion, conductive pattern (111d) is formed as well.

Keypad 7 is arranged on the conductive pattern formed on the surface of fewer-layer section 14. Further, using solder 9, electronic chip 8 is anchored and connected to wiring patterns and built-up vias 4 through connection pads 10. For solder 9, Sn/Ag/Cu was used.

Moreover, through-hole 63 is formed, penetrating base substrate 3, further penetrating first substrate 1 and second substrate 2, and connecting wiring pattern (111a) and wiring pattern (211d) of second substrate 2. The inner surface of through-hole 63 is plated so as to electrically connect wiring patterns. The area enveloped by plated through-hole 63 may be filled with resin such as epoxy-resin.

The term "through-hole" refers to an electrical connection between conductors using a hole or aperture. In general, a through-hole may be referred to as a platted through-hole. A through-hole can provide a conductive connection between a conductor formed on one end of the through-hole to a conductor formed on the other end of the through-hole. For example, a through-hole can provide a conductive connection between outer layers of a multi-layer printed circuit board and/or may provide conductive connection to or between inner circuits of a multilayer printed circuit board. In forming a through-hole, a penetrating hole is first formed by drilling, and a conductor is formed in the penetrating hole by metal plating (such as copper plating). In addition to providing electrical connection as noted above, a through-hole can receive the terminal of an electronic part for insertion mounting and fixing the electronic part to a printed circuit board.

Figure 3:
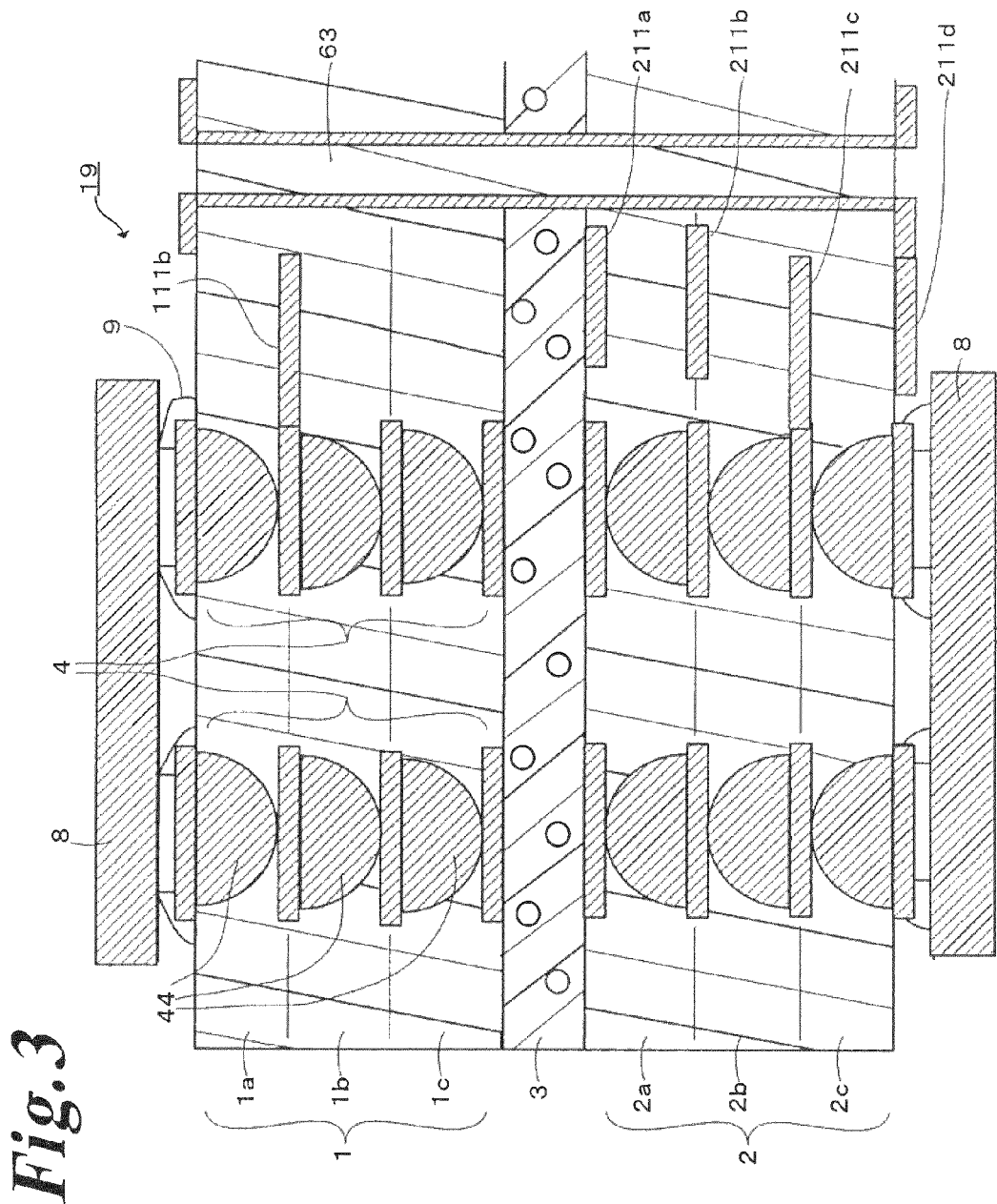
FIG. 3 is a cross-sectional view illustrating a wiring board according to an embodiment of the present invention.
Figure 4:
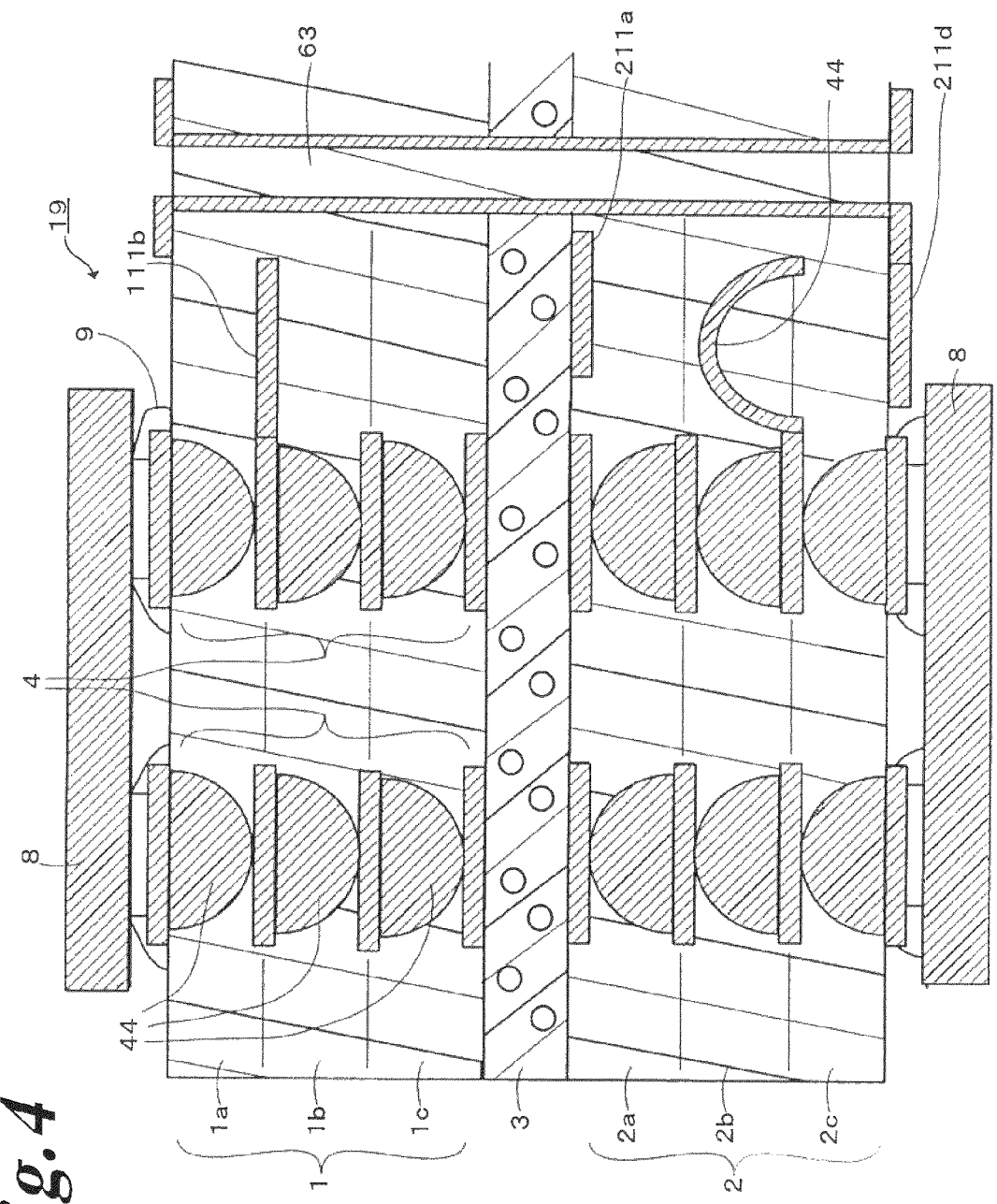
FIG. 4 is a cross-sectional view illustrating a wiring board according to an embodiment of the present invention.

In first substrate 1 and second substrate 2, multiple built-up vias 4 are formed. Built-up vias 4 are structured by stacking vias 44 formed in each insulation layer (1a-1c, 2a-2c). Built-up vias 4 connect required portions of wiring patterns (111a-111d) and also connect required portions of wiring patterns (211a-211d). On the inner surface of each via 44 forming built-up via 4, a conductive layer made of copper plating or the like is formed. As shown in FIG. 3, the interior of each via 44 is filled with conductor such as copper. However, as shown in FIG. 4, the interior of via 44 may be filled with resin such as epoxy-resin. Thus, the term "via" as used herein, means an opening formed in a substrate such as an insulating layer.

Wiring board 19 having the above structure, for example, transmits operational signals from keypad 7 to an IC chip through built-up vias 4, wiring patterns (111a-111d) and through-hole 63, and the signals are then processed at the IC chip. By doing so, varieties of signal processing may be conducted.

Also, as described above, wiring board 19 is structured with multi-layer section 13 and fewer-layer section 14 and has a step portion. And at the lower portion of fewer-layer section 14, a large-volume component such as a cell-phone battery may be placed.

In the embodiment of FIG. 2, since base substrate 3 is made of glass-epoxy resin containing silica filler, it is highly rigid. Therefore, multi-layer section 13, because of base substrate 3 placed there, is highly rigid compared with fewer-layer section 14. On the other hand, fewer-layer section 14 is relatively flexible compared with multi-layer section 13. Thus, it is possible to place electronic components on either sections 13 or 14 according to the reliability level they require.

Figure 5:
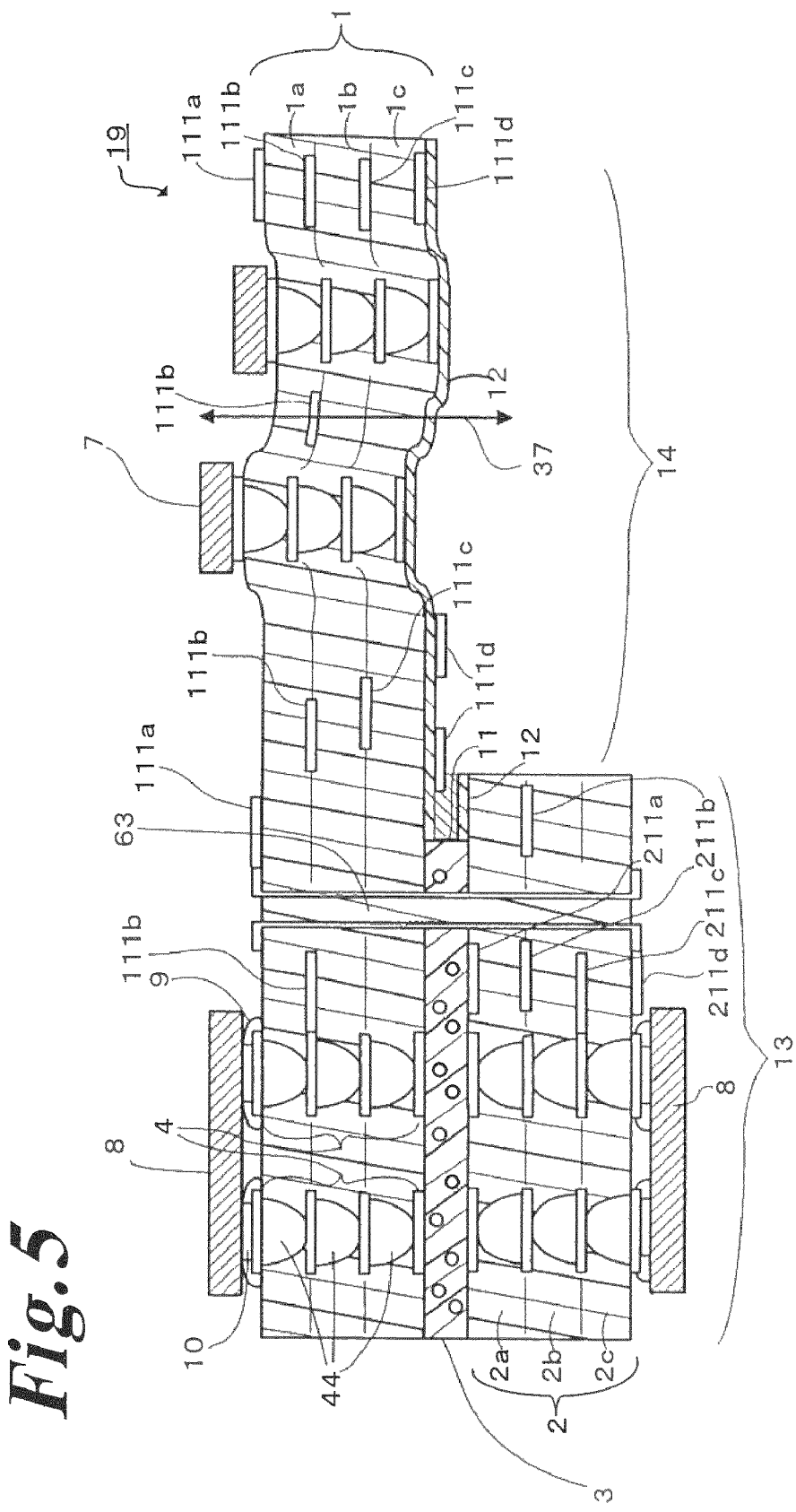
FIG. 5 is a cross-sectional view illustrating a wiring board according to an embodiment of the present invention.

Also, for example, when the electronic device is dropped and an impact or the like is exerted on wiring board 19, due to the relative flexibility of fewer-layer section 14 compared with multi-layer section 13, fewer-layer section 14 vibrates as shown by arrow 37 in FIG. 5. Since portions of fewer-layer section 14 vibrate, the impact from being dropped or the like is converted to vibration motion energy, and the impact is absorbed accordingly. As a result, the risk of rupture in the wiring that connects the electronic components mounted on wiring board 19 may be minimized.

Furthermore, since first insulation layer 1 and second insulation layer 2 are formed with pliable resin, when an impact is exerted on the wiring board, first insulation layer 1 and second insulation layer 2 absorb the impact as shock-absorbing layers.

Also, built-up vias 4 are formed as a stacked via made by laminating multiple vias 44. By making such a stacked interlayer connection structure, the wiring length is shortened, and thus preferable for mounting electronic components requiring large amounts of electricity.

Figure 6:
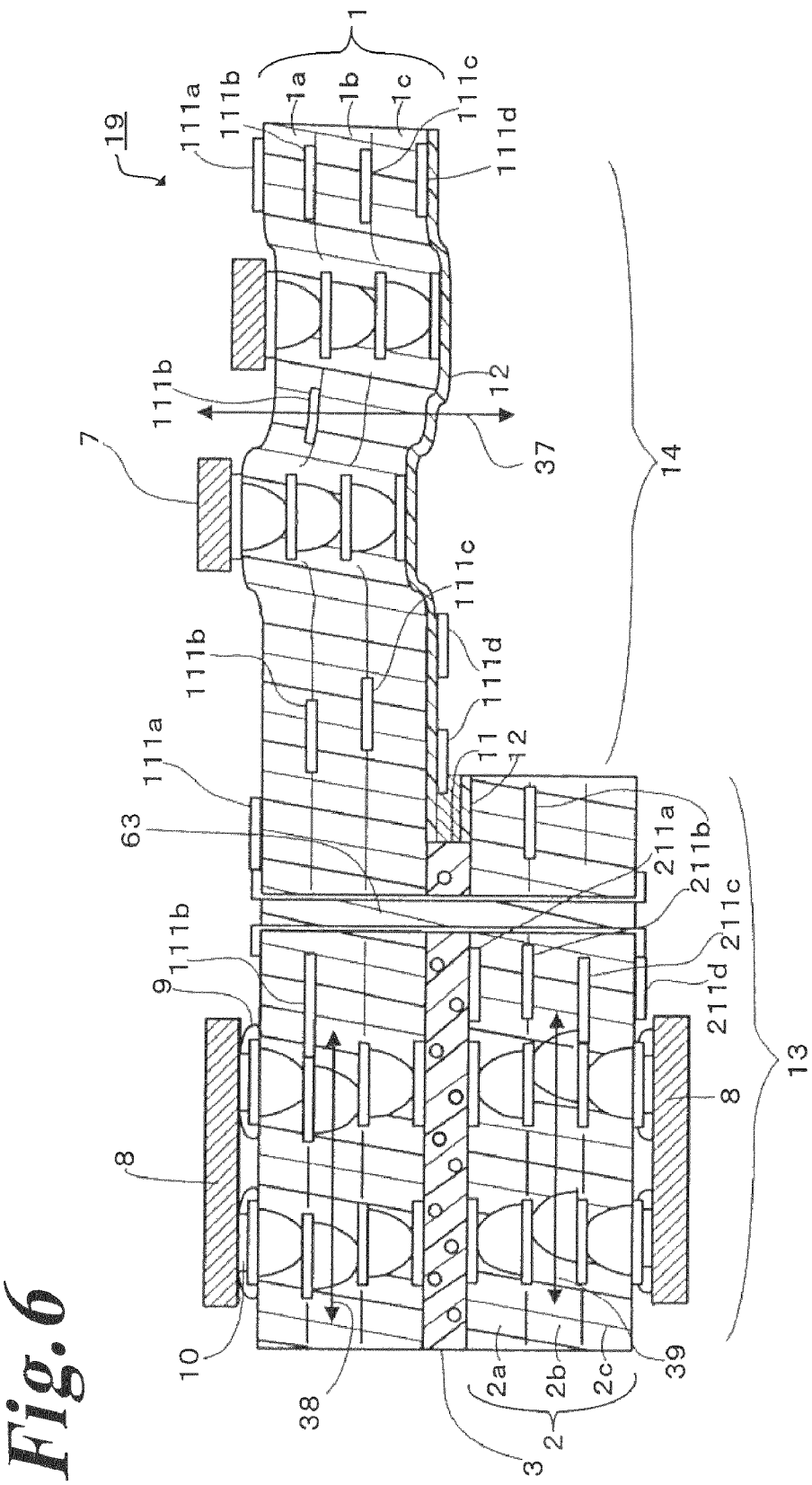
FIG. 6 is a cross-sectional view illustrating a wiring board according to an embodiment of the present invention.

Moreover, built-up vias 4 have a certain degree of mobility. Therefore, for example, when the electronic device is dropped and an impact is exerted on wiring board 19, the impact may be absorbed at built-up vias 4 through the movement of built-up vias 4 as shown by arrows 38, 39 in FIG. 6. As a result, the risk of rupture in the wiring that connects the electronic components mounted on wiring board 19 may be minimized.

In addition, if solid material or the like is filled in interlayer groove section 11, when the impact from being dropped is exerted on the wiring board, interlayer groove section 11 cushions the impact as a shock-absorbing layer. Accordingly, when interlayer groove section 11 is formed, by improving tolerance to impact from being dropped, the risk of rupture in the wiring that connects the electronic components mounted on the wiring board may be minimized.

Also, in certain circumstances, two wiring boards of the present invention may be combined and sold in such a way that each fewer-layer section 14 is closely placed to provide compact shipment of the boards as will be further discussed with respect to FIG. 7T below. Here, if a wiring pattern is formed at the step portion created when first substrate 1 and second substrate 2 are laminated, in a circumstance when a user or the like uses the combined wiring boards of the present invention separately, warping of the wiring boards may be prevented. Namely, multi-layer section 13, because of base substrate 3 positioned there, is rigid compared with fewer-layer section 14. Thus, when a user, such as a device manufacturer uses the combined wiring boards of the present invention separately, warping does not occur at multi-layer section 13. On the other hand, fewer-layer section 14 is flexible compared with multi-layer section 13. Thus, when a user separates the combined wiring boards of the present invention, warping could possibly occur at fewer-layer section 14, especially at the step portion of fewer-layer section 14 created when first substrate 1 and second substrate 2 are laminated. However, if a wiring pattern is formed at the step portion, in a circumstance when a user or the like uses the combined wiring boards of the present invention separately, warping may be reduced or prevented.

In the following, a method of manufacturing wiring board 19 according to the present invention is described.

Figure 7A:
FIG. 7A illustrates a step of a method to manufacture a wiring board according to an embodiment of the present invention.

First, as shown in FIG. 7A, dummy core 52, which will form adhesion prevention layer 12, is prepared. Dummy core 52 is made, for example, of a C-stage epoxy-resin. On dummy core 52, copper foil 51 is deposited.

Figure 7B:
FIG. 7B illustrates a step of a method to manufacture a wiring board according to an embodiment of the present invention.

Next, as shown in FIG. 7B, by patterning copper foil 51, conductive patterns 111d are formed at a predetermined position.

Figure 7C:
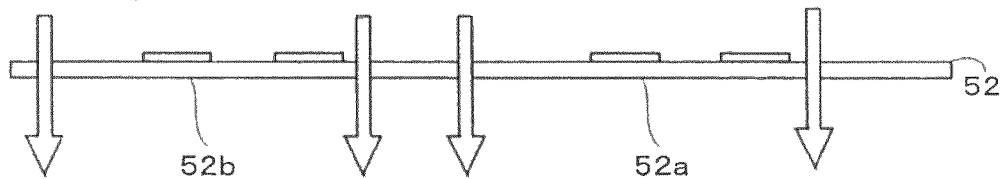
FIG. 7C illustrates a step of a method to manufacture a wiring board according to an embodiment of the present invention.

Next, as shown by arrows in FIG. 7C, dummy core 52 is cut by a laser or the like (represented by the arrows in FIG. 7C) to adjust its length to a length preferred for use in wiring board 19. As seen in FIG. 7C, the dummy core 52 is cut into dummy cores 52a and 52b, which will be used to form separate wiring boards as described below.

Figure 7D:
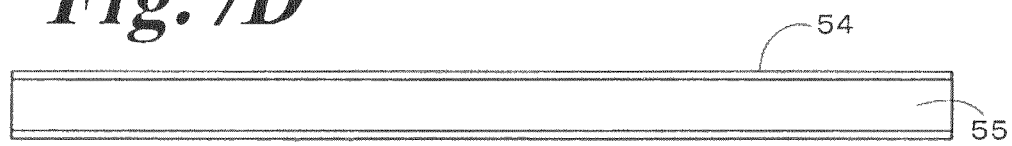
FIG. 7D illustrates a step of a method to manufacture a wiring board according to an embodiment of the present invention.

In addition, as shown in FIG. 7D, core 55, which functions as base substrate 3, is prepared. Core 55 is made, for example, of highly rigid material such as glass-epoxy resin containing inorganic filler such as glass filler or silica filler. On both surfaces of core 55, copper foil 54 is deposited.

Figure 7E:
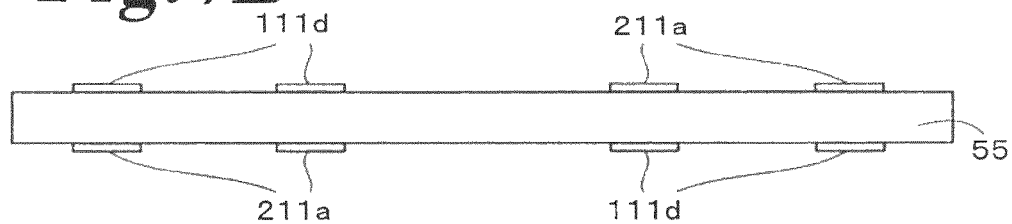
FIG. 7E illustrates a step of a method to manufacture a wiring board according to an embodiment of the present invention.

Next, as shown in FIG. 7E, by patterning copper foil 54, conductive patterns (111d, 211a) are formed to structure wiring patterns.

Figure 7F:
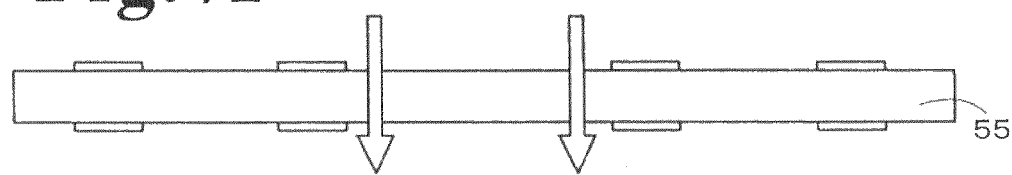
FIG. 7F illustrates a step of a method to manufacture a wiring board according to an embodiment of the present invention.

Next, as shown by an arrow in FIG. 7F, in core 55 using a laser or the like, a hole to insert dummy core 52 is formed as shown by the arrows in FIG. 7F.

Figure 7G:
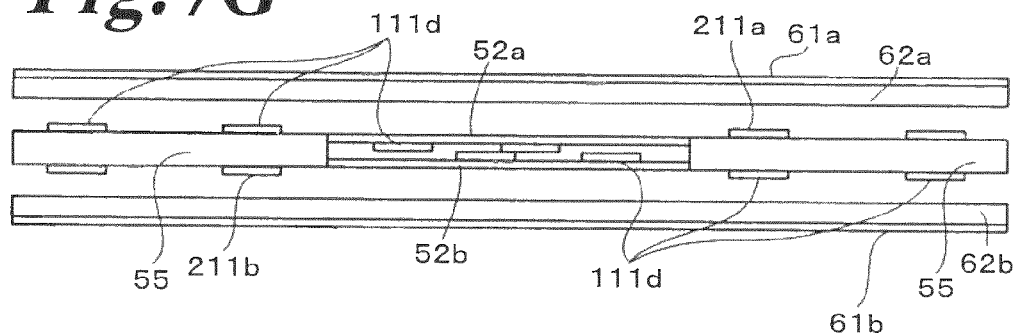
FIG. 7G illustrates a step of a method to manufacture a wiring board according to an embodiment of the present invention.

Next, as shown in FIG. 7G, cut-out dummy cores (52a, 52b) are placed in such a way that conductive pattern 111d is laminated facing inward. Then, laminated dummy cores (52a, 52b) and cut core 55 are horizontally connected. Then, on the top and bottom of dummy cores (52a, 52b) and core 55, prepreg (62a, 62b) are laminated. For prepreg (62a, 62b), low-flow prepreg impregnated with low-flow epoxy-resin is preferred. Then, on the surfaces of prepreg (62a, 62b), copper foils (61a, 61b) are deposited.

Figure 7H:
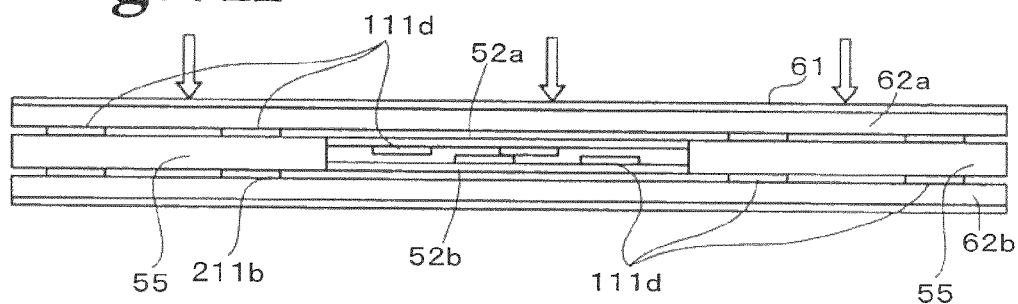
FIG. 7H illustrates a step of a method to manufacture a wiring board according to an embodiment of the present invention.

Next, as shown in FIG. 7H, on the laminate shown in FIG. 7G, pressure is applied as schematically represented by arrows in FIG. 7H. Pressure is, for example, applied by hydraulic power using hydraulic pressing equipment under conditions calling for temperature of 200° C., pressure of 40 kgf and pressing time of three (3) hours. By doing so, resin is squeezed out from the prepreg, and the prepreg (62a, 62b) and core material 55 will be integrated accordingly. At this time, since dummy cores (52a, 52b) are made of a C-stage epoxy-resin, the materials in dummy core 52 are not integrated with each other. For applying pressure, vacuum pressing may be employed instead of hydraulic pressing. By conducting vacuum pressing, bubbles may be kept from mixing into the resin which forms the insulation layers. Vacuum pressing is conducted, for example, for an hour. Peak heating temperature is set, for example, at 175° C.; and vacuum-pressing pressure is set, for example, at $3.90 \times 10^6$ [Pa].

Figure 7I:
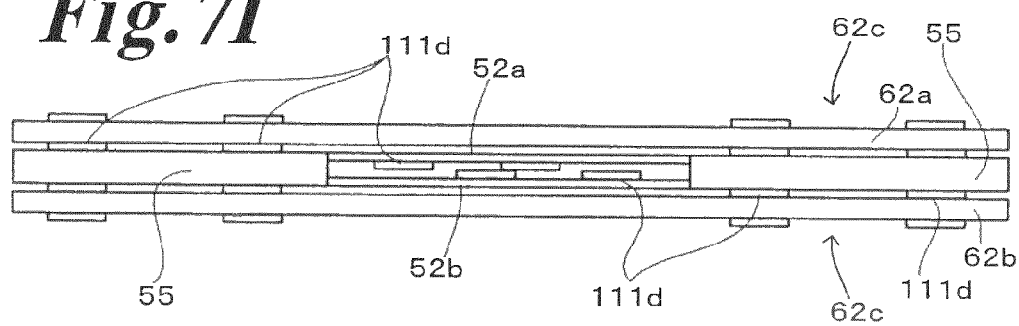
FIG. 7I illustrates a step of a method to manufacture a wiring board according to an embodiment of the present invention.

Next, as shown in FIG. 7I, by removing the unnecessary portions of copper foil 61 from the laminate shown in FIG. 7H, wiring patterns 62c are formed.

Figure 7J:
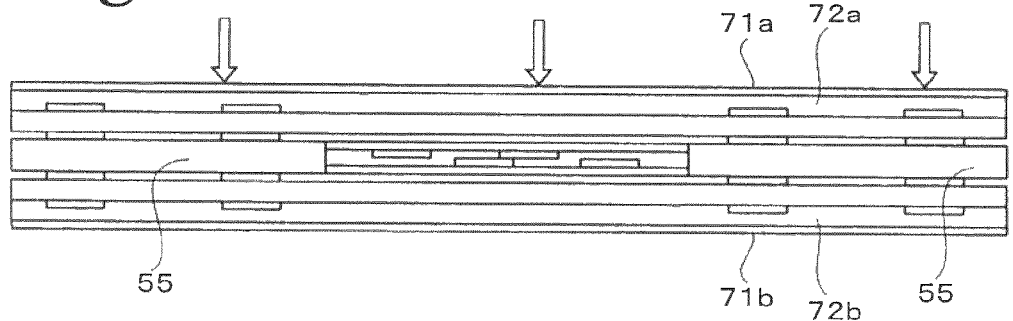
FIG. 7J illustrates a step of a method to manufacture a wiring board according to an embodiment of the present invention.

Next, as shown in FIG. 7J, epoxy resin (72a, 72b) is further laminated to form inner layers. On both surfaces of epoxy resin (72a, 72b), copper foil (71a, 71b) is formed. Then, pressure is applied as represented by the arrows in FIG. 7J. Pressure may be applied, for example, by hydraulic power using hydraulic pressing equipment, or by vacuum pressing.

Figure 7K:
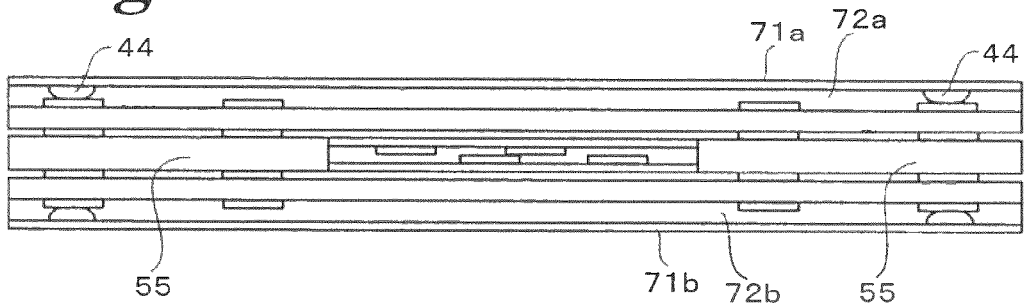
FIG. 7K illustrates a step of a method to manufacture a wiring board according to an embodiment of the present invention.

Then, as shown in FIG. 7K, vias 44 are formed. Namely, in epoxy resin 72 made of insulation resin, openings for via-holes are formed. Those openings may be formed by a laser beam. Then, to remove resin residue remaining on the side and bottom surfaces of the openings formed by the laser beam, a desmear treatment is preferably performed. The desmear treatment is performed using an oxygen plasma discharge treatment, a corona discharge treatment, an ultra-violet laser treatment or an exima laser treatment, for example.

In the openings formed by a laser beam, conductive material is filled to form filled via holes. As for conductive material, conductive paste or metal plating formed by an electrolytic plating process is preferred. For example, vias 44 are filled with conductor such as copper plating. To reduce the manufacturing cost and improve productivity by simplifying the filled-via forming step, filling with a conductive paste is preferred. For example, a conductive paste (such as thermoset resin containing conductive particles) may be printed by screen-printing, filled in vias 44 and cured. By filling the interiors of vias 44 with the same conductive paste material, connection reliability when thermo-stress is exerted on vias 44 may be improved. On the other hand, regarding connection reliability, metal plating formed by an electrolytic plating process is preferred. Especially, electrolytic copper plating is preferred.

Figure 7L:
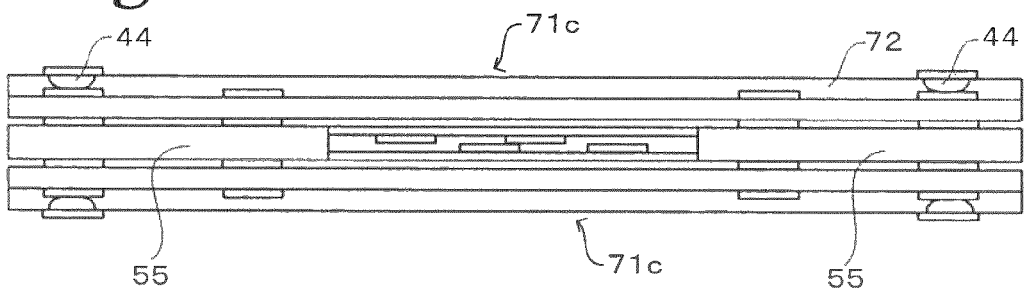
FIG. 7L illustrates a step of a method to manufacture a wiring board according to an embodiment of the present invention.

Then, as shown in FIG. 7L, by removing the unnecessary portions of copper foil 71, inner-layer patterns 71c are formed.

Figure 7M:
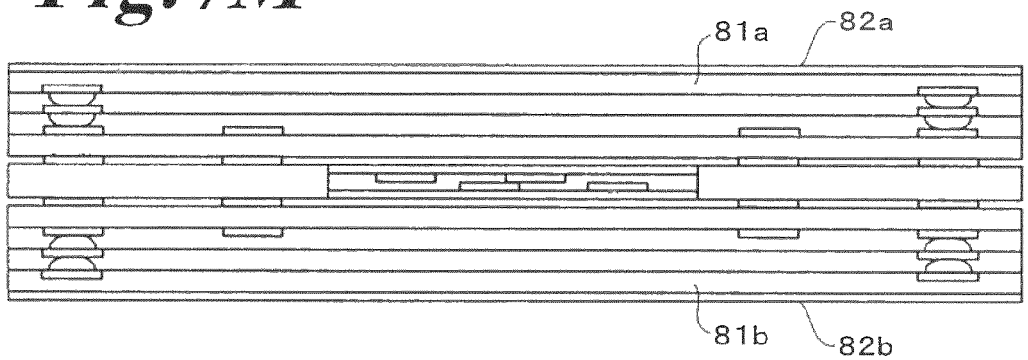
FIG. 7M illustrates a step of a method to manufacture a wiring board according to an embodiment of the present invention.

Next, as shown in FIG. 7M, after inner layers and vias are further formed, epoxy-resin (81a, 81b) is laminated to form outer layers. On both surfaces of epoxy-resin (81a, 81b), copper foil (82a, 82b) is deposited. Here, a copper foil sheet containing resin (Resin Copper Film: RCF) may be deposited and pressed.

Figure 7N:
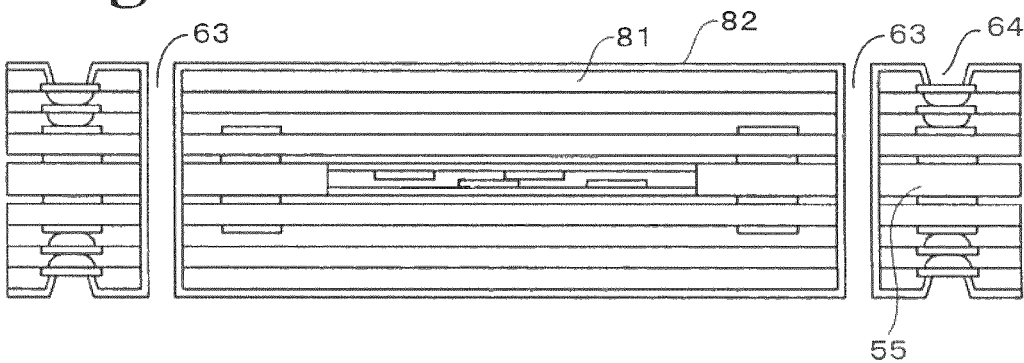
FIG. 7N illustrates a step of a method to manufacture a wiring board according to an embodiment of the present invention.
Figure 7O:
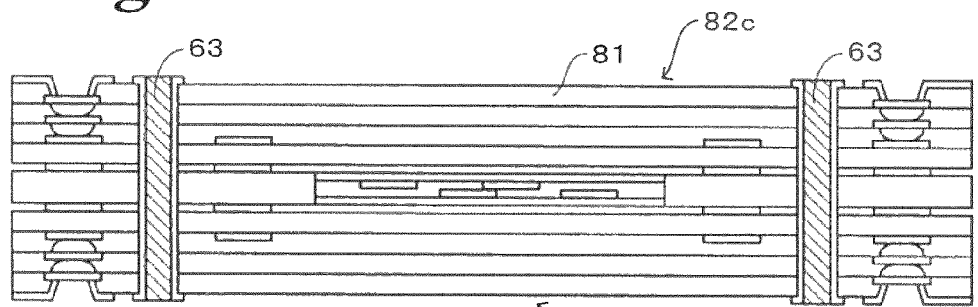
FIG. 7O illustrates a step of a method to manufacture a wiring board according to an embodiment of the present invention.

Next, as shown in FIG. 7N, vias 64 are formed in the RCF. Further, in the laminated layers shown in FIG. 7M, holes 63 are bored by a drill. The holes 63 penetrate the base substrate and insulation layers formed on both sides of the base substrate. By doing so, through-holes 63 are formed. Then, using copper plating or the like, the interiors of the vias 64 and through-holes 63 are provided with a conductor. As seen in FIG. 7O, by patterning the surface copper foil, conductive patterns are formed.

Next, as shown in FIG. 7O, the interiors of through-holes 63 are filled with epoxy resin, and by removing unnecessary portions of copper foil (82a, 82b), outer-layer patterns 82c are formed.

Figure 7P:
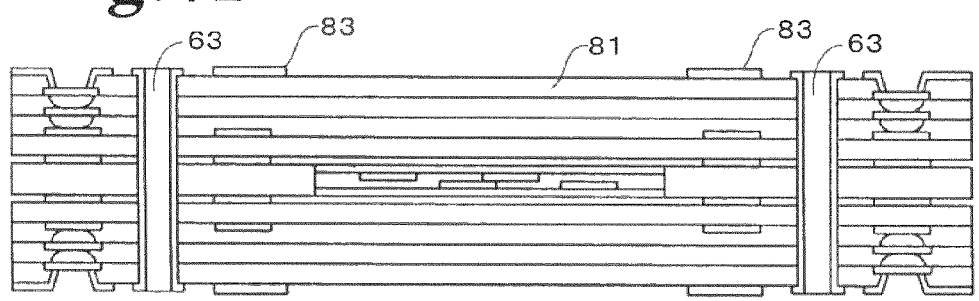
FIG. 7P illustrates a step of a method to manufacture a wiring board according to an embodiment of the present invention.

Next, as shown in FIG. 7P, solder resist 83 is formed. Here, the solder resist indicates heat-resistant coating material, which is used when applying solder to cover the portions which are intended to keep the solder from adhering thereto. For solder-resist varieties, photo-setting-type solder resist and thermo-setting-type solder resist may be used. For a coating method, a screen-printing method or curtain-coating method may be used.

Figure 7Q:
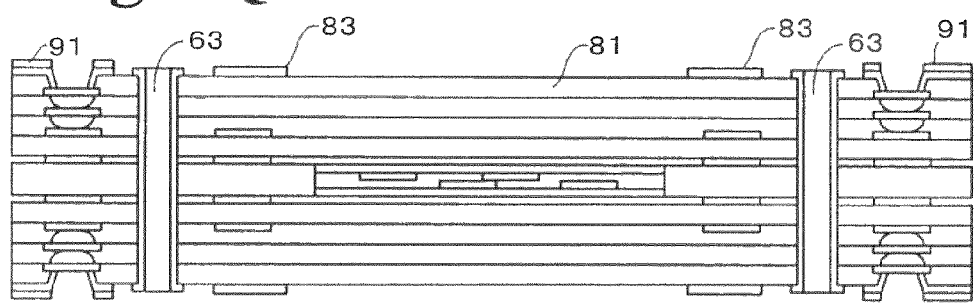
FIG. 7Q illustrates a step of a method to manufacture a wiring board according to an embodiment of the present invention.

Next, as shown in FIG. 7Q, to protect outer-layer patterns, gold plating 91 is performed by chemical plating. Other than chemical plating, methods such as fusion plating and electrical plating may be used. Moreover, methods other than gold plating, such as alloy plating may be used.

Figure 7R:
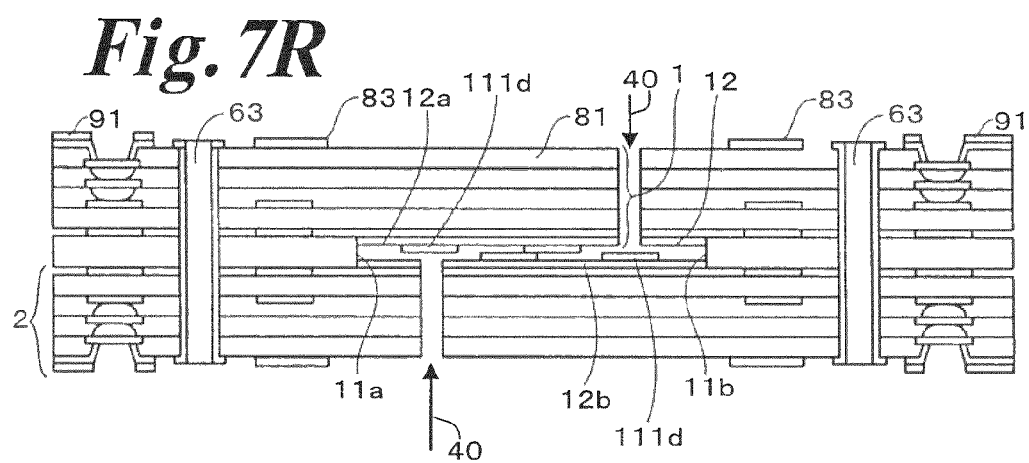
FIG. 7R illustrates a step of a method to manufacture a wiring board according to an embodiment of the present invention.

Next, as shown by arrows 40 in FIG. 7R, laser beams from laser processing equipment, for example a $CO_2$ laser, are beamed using conductive patterns (111d) as a stopper to cut insulation layers and the copper foil sheet containing resin (RCF). Here, the thickness of conductive patterns (111d) is preferred to be made approximately 5-10 μm: if too thin, laser beams penetrate the pattern; and if too thick, conductive circuit patterns with a fine line width are difficult to form.

By laser cutting as shown in FIG. 7R, interlayer groove sections (11a, 11b) are also formed. Namely, by laser cutting, using adhesion prevention layer (12a, 12b) formed on first substrate 1 and adhesion prevention layer 12 formed on second substrate 2 as groove side-walls, and one surface of base substrate 3 as the groove bottom surface, interlayer groove sections (11a, 11b) are formed.

Figure 7S:
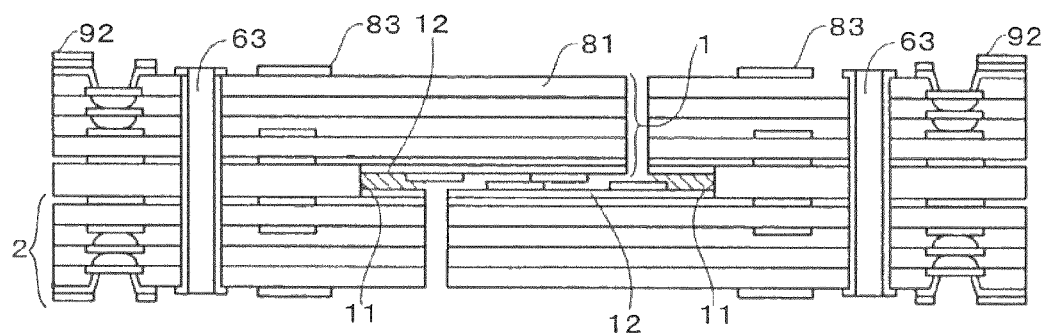
FIG. 7S illustrates a step of a method to manufacture a wiring board according to an embodiment of the present invention.

Lastly, as shown in FIG. 7S, electronic components 92 are mounted. Electronic components 92 are electronic chip 8 and keypad 7, for example. Further, interlayer groove sections (11a, 11b) may be filled with elastic material, viscous material or the like as depicted by the darkened portion shown in the interlayer groove portions in FIG. 7S.

Figure 7T:
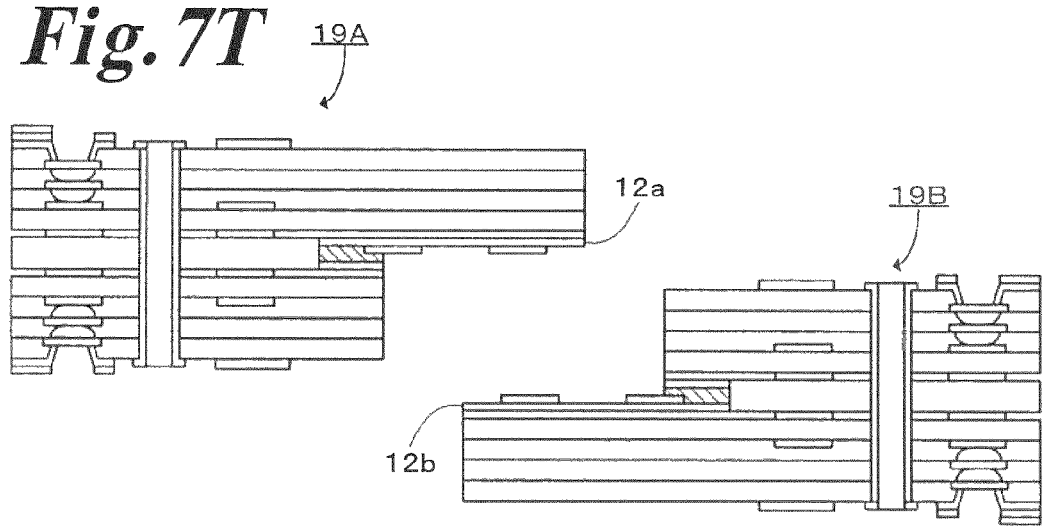
FIG. 7T is a view illustrating wiring boards according to an embodiment of the present invention.

Then, as shown in FIG. 7T, wiring board (19A) and wiring board (19B) are used separately. In such a circumstance, since adhesion prevention layers (12a, 12b) are formed, wiring board (19A) and wiring board (19B) may be separated by a simple process to be used separately. Regarding a wiring board according to embodiments of the present invention, when an electronic device such as a cell phone receives an impact from being dropped or the like, connection breakage of electronic components or the like mounted in the wiring board may be prevented. In addition, when being shipped to a user, the wiring board can be handled compactly, and when being used by the user, the combined wiring boards can be separated easily.

In the first embodiment of the present invention described in relation to FIG. 2, base substrate 3 contains resin containing inorganic filler, and first insulation layer 1 and second insulation layer 2 contain pliable resin. However, according to another embodiment of the present invention, as shown in FIG. 8, base substrate 3 contains pliable resin and first insulation layer 1 and second insulation layer 2 contain base material of resin-impregnated inorganic fabric. The rest of the structure is substantially the same as in the embodiment of FIG. 2.

The pliable resin forming base substrate 3 contains mainly epoxy resin. The base material of resin-impregnated inorganic fabric forming first insulation layer 1 and second insulation layer 2 is prepared by curing prepreg. The prepreg is prepared by impregnating glass-cloth inorganic fabric with epoxy resin and preliminarily thermosetting the resin to advance the level of curing. Although the resin to be used for the prepreg is preferred to have low-flow characteristics, a resin with regular-flow characteristics may also be used. Also, prepreg may be prepared by reducing the amount of epoxy resin to be impregnated in glass-cloth inorganic fabric.

Since base substrate 3 is formed with pliable resin in the embodiment of FIG. 8, when an impact is exerted on the wiring board, base substrate 3 absorbs the impact as a shock-absorbing layer. Therefore, when an electronic device such as a cell phone receives an impact from being dropped or the like, the risk of rupture in the wiring that connects the electronic components mounted on the wiring board may be minimized.

The manufacturing method of a wiring board according to the embodiment of FIG. 8 is similar to the method of FIGS. 7A-7T, except that a base material of resin impregnated inorganic fabric is used for a resin to be laminated in FIGS. 7G, 7J, and 7M. The rest of the manufacturing method is substantially the same as in the embodiment of FIGS. 7A-7T.

According to the embodiment of the present invention described in relation to FIG. 2, base substrate 3 contains resin containing inorganic filler, and first insulation layer 1 and second insulation layer 2 contain pliable resin. However, according to another embodiment of the present invention, as shown in FIG. 9, base substrate 3 contains pliable resin and first insulation layer 1 and second insulation layer 2 contain resin containing inorganic filler. The rest of the structure is substantially the same as in the embodiment of FIG. 2.

The pliable resin forming base substrate 3 contains mainly epoxy resin. The resin containing inorganic filler forming first insulation layer 1 and second insulation layer 2 is prepared by combining silica filler with epoxy resin. For the silica filler, fused silica ($SiO_2$) is used.

Since base substrate 3 is formed with pliable resin in the embodiment of FIG. 9, when an impact is exerted on the wiring board, base substrate 3 absorbs the impact as a shock-absorbing layer. Therefore, when an electronic device such as a cell phone receives an impact from being dropped or the like, the wiring that connects the electronic components mounted on the wiring board may be prevented.

The manufacturing method of a wiring board according to the embodiment of FIG. 9 is similar to the method of FIGS. 7A-7T, except that a resin containing inorganic filler is used for a resin to be laminated in FIGS. 7G, 7J, and 7M. The rest of the manufacturing method is substantially the same as in the embodiment of FIGS. 7A-7T.

Figure 10:
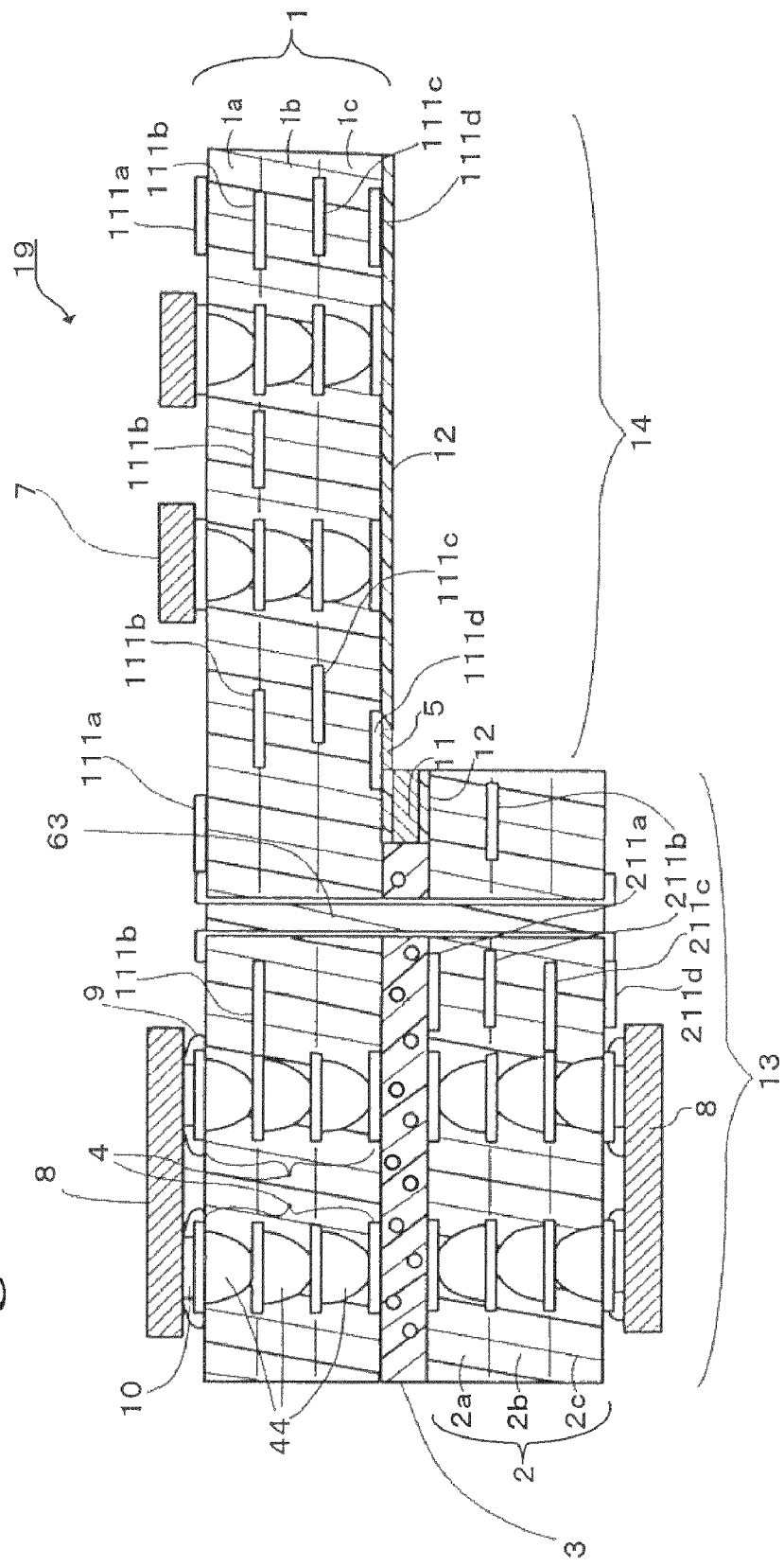
FIG. 10 is a cross-sectional view of a wiring board according to an embodiment of the present invention.

As shown in FIG. 10, in the another embodiment, at the portion where adhesion prevention layer 12 is made flush with the edge of second substrate 2, opening 5 is formed. The rest of the structure is substantially the same as in the embodiment of FIG. 2. Under opening 5, part of wiring pattern (111d) is positioned to provide a groove, which forms an aperture. The groove may be filled with elastic material or viscous material such as silicone gel or silicone oil. When wiring board 19 receives an impact from being dropped, the aperture or silicone gel or silicone oil filled in the groove cushions the impact as a shock-absorbing layer. Therefore, by making such a structure, tolerance to impact from being dropped may be improved.

Also, if solid material or the like is filled in opening 5, the filled solid material or the like may play a role in decreasing warping at the juncture of multi-layer section 13 and fewer-layer section 14 where the number of layers is reduced. Accordingly, at the juncture of multi-layer section 13 and fewer-layer section 14, cracks may be prevented. Furthermore, if opening 5 is filled, for example, with solid material such as resin, the filled solid material plays a role in protecting conductive pattern (111d) mounted on first substrate 1. Therefore, tolerance to corrosion on conductive pattern (111d) may be improved.

Figure 11A:
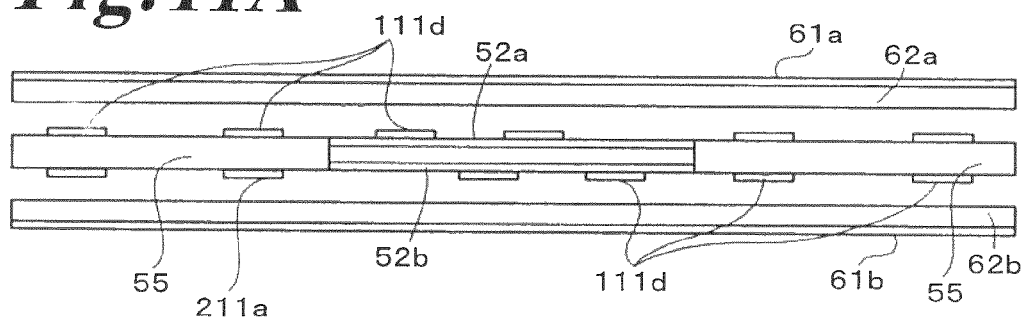
FIG. 11A illustrates a step of a method to manufacture a wiring board according to an embodiment of the present invention.
Figure 11B:
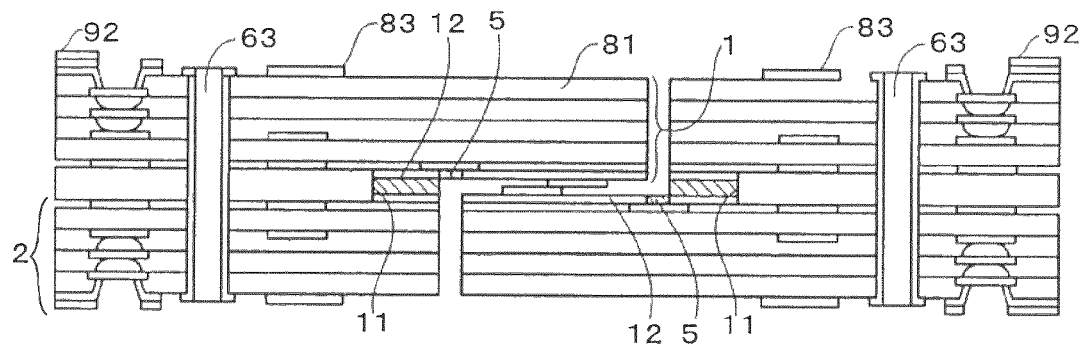
FIG. 11B illustrates a step of a method to manufacture a wiring board according to an embodiment of the present invention.

A method of manufacturing a wiring board according to the embodiment of FIG. 10 is similar to the method of manufacturing a wiring board according to the embodiment in reference to FIGS. 7A-7F, FIGS. 7H-7R and 7T. However, instead of FIG. 7G, as shown in FIG. 11A, cut-out dummy cores (52a, 52b) are placed in a way so that conductive patterns 111d are laminated facing outward. Moreover, instead of FIG. 7S, as shown in FIG. 11B, opening 5 is filled with viscous material such as silicone oil. The opening 5 of FIGS. 10 and 11 may be implemented with any of the embodiments of the wiring board discussed above.

As noted above, embodiments of the invention are not limited to one end of first substrate 1 and one end of second substrate 2 being aligned. As shown in FIG. 12A, one end of second substrate 2 may protrude from one end of first substrate 1, and one end of the first substrate 1 may protrude from the second substrate 2. Here, the protruding portions of the first and second substrates make up a periphery portion of the wiring board that is thinner than a center portion of the wiring board which includes the first substrate 1, second substrate 2 and base 3.

Also, as shown in FIG. 12B, opposite ends of first substrate 1 may protrude from ends of second substrate 2. Here, the protruding portions of only the first and second substrate make up a periphery portion of the wiring board that is thinner than a center portion of the wiring board which includes the first substrate 1, second substrate 2 and base 3.

In a wiring board according to the embodiment of FIG. 2, first substrate 1 and second substrate 2 are in a layered structure having a rectangular outline. However, they are not limited to such, but may be in a layered structure having a circular, hexagonal or octagonal outline.

Also, in a wiring board according to the embodiment of FIG. 2, base substrate 3 is formed with glass-epoxy resin containing fused silica ($SiO_2$), but it is not limited to such. As for silica filler, crystalline silica ($SiO_2$) may also be used, and instead of silica filler, glass filler may possibly be combined. As for glass filler, aluminum oxide ($Al_2O_3$), magnesium oxide (MgO), boron nitride (BN), or aluminum nitride (AlN) may be used. Also, sodium oxide ($Na_2O$), potassium oxide ($K_2O$), boric oxide ($B_2O_3$), and phosphoric oxide ($P_2O_5$) may be used in combination thereof. Furthermore, as for inorganic filler, it is not limited to silica filler or glass filler, but inorganic incombustible agents such as antimony trioxide, antimony pentoxide, magnesium hydroxide, aluminum hydroxide, guanidinium salts, zinc borate, molybdic compound, and zinc stannate may be used. Talc, barium sulfate, calcium carbonate, or mica powder may also be used.

Also, in a wiring board according to the embodiment of FIG. 2, first insulation layer and second insulation layer 2 are made of pliable resin containing mainly epoxy resin. However, pliable resin is not limited to such, but any one of the following resins or a combination thereof may be used: epoxy, polyimide, polycarbonate, polyphenylen ether denaturated, polyphenylen oxide, polybutylene-telephtalate, polyacrylate, polysulfone polyphenylen-sulfid, polyether-etherketone, tetrafluoroethylene, bismaleimide, polysulfone, polyethersulfone, polyphenylsulfone, polyphthalamide, polyamide-imide, polyketone, polyacetale. As for epoxy resin, the following may be used: naphthalene-type epoxy resin, dicyclo-pentadiene-type epoxy resin, biphenyl-type epoxy resin, bisphenole A-type epoxy resin, bisphenol F-type epoxy resin, bisphenol S-type epoxy resin, phenol novolac-type epoxy resin, alkylphenol novolac-type epoxy resin, alalkyl-type epoxy resin, biphenol-type epoxy resin, anthracene-type epoxy resin, epoxydated condensate of phenolic groups and aromatic compound aldehyde containing phenolic hydroxyl groups, triglycidyl isocyanurate and alicyclic epoxy resin.

According to the embodiment of FIG. 2, as for solder 9, Sn/Ag/Cu was used. However, solder 9 is not limited to such; solder containing antimony, tin, lead, indium or copper may be used. Also, eutectic crystal metals such as Sn/Sb, Sn/Ag, Sn/Pb or Sb/Cu may be used as well. Among such eutectic crystal metals, to avoid having a bad influence on the substrates, using metals having relatively low melting temperatures, 250° C. or lower, is preferred.

According to the embodiment of FIG. 2, interlayer groove section 11 is filled with silicone gel, which is viscous silicone. However, such is not the only example, and interlayer groove section 11 may be filled with solid material. As for solid material to be filled in interlayer groove section 11, high-polymer rubber is preferred as a solid material having viscosity and elasticity. Specifically, butyl rubber, isoprene rubber, butadiene rubber, styrene-butadiene rubber or ethylene-propylene rubber may be used. Moreover, interlayer groove section 11 may be filled with a gas. As the gas to be filled in interlayer groove section 11, a rare gas such as argon, or nitrogen or oxygen may also be used.

Also, according to the embodiment of FIG. 8, a prepreg was prepared by impregnating glass-cloth inorganic fabric with epoxy resin and preliminarily thermosetting the resin to advance the level of curing. However, such is not the only example. In addition to epoxy resin, or other than epoxy resin, any one of the following resins or a combination thereof may be used to prepare prepreg: polyimide, polycarbonate, polyphenylen ether denaturated, polyphenylen oxide, polybutylene-telephtalate, polyacrylate, polysulfone polyphenylen-sulfid, polyether-etherketone, tetrafluoroethylene, bismaleimide, polysulfone, polyethersulfone, polyphenylsulfone, polyphthalamide, polyamide-imide, polyketone, polyacetale.

Also, for the inorganic fabric, it is not limited to glass cloth, but fabrics such as alumina fabric, carbon fabric (carbon fiber), silicon carbide fabric, silicon nitride fabric or the like may be used singly or in combination thereof.

According to the embodiment of FIG. 10, in opening 5, silicone gel, which is viscous silicone, is filled. However, the material to be filled in opening 5 is not limited to such, but solid material may be used. As solid material to be filled in opening 5, high-polymer rubber as a solid material having viscosity and elasticity is preferred. More specifically, butyl rubber, isoprene rubber, butadiene rubber, styrene-butadiene rubber or ethylene-propylene rubber may be used. As the material to be filled in opening 5, a liquid or solid material is preferred, but a gas may be used. In such a case, as the gas to be filled in opening 5, a rare gas such as argon, or nitrogen or oxygen may be used.

In addition, first substrate 1 is not necessarily formed single-layered, but may be formed multi-layered. Namely, first substrate 1 may be structured with a lower-layer insulation layer and an upper-layer insulation layer. Here, a lower-layer insulation layer indicates the insulation layer formed close to base substrate 3; and an upper-layer insulation layer indicates an insulation layer formed on the outer surface of the wiring board. Furthermore, first substrate 1 may be structured with a lower-layer insulation layer, an upper-layer insulation layer and an intermediate insulation layer placed in between. The intermediate insulation layer may be made multi-layered. According to the embodiment of FIG. 2, the lower-layer insulation layer corresponds to epoxy-resin layer (1c), the intermediate insulation layer corresponds to epoxy-resin layer (1b) and the upper-layer insulation layer corresponds to epoxy-resin layer (1a).

Also, the second substrate is not necessarily formed single-layered, but may be formed multi-layered. Second substrate 2 may also be structured with a lower-layer insulation layer and an upper-layer insulation layer. Furthermore, second substrate 2 may be structured with a lower-layer insulation layer, an upper-layer insulation layer and an intermediate insulation layer placed in between. In the First Embodiment, the lower-layer insulation layer corresponds to epoxy-resin layer (2a), the intermediate insulation layer corresponds to epoxy-resin layer (2b) and the upper-layer insulation layer corresponds to epoxy-resin layer (2c). On top of the upper-layer insulation layer and on top of the lower-layer insulation layer, conductive patterns may be formed. Then, those conductive patterns may be connected with each other through vias 44.

The present invention may be employed in a wiring board which can mount electronic components, specifically, in a wiring board which can mount electronic components for compact electronic devices.

What is claimed is:

1. A wiring board comprising:
   a first substrate;
   a second substrate having a smaller mounting area than a mounting area of the first substrate; and
   a base substrate laminated between the first substrate and the second substrate such that the first substrate extends beyond at least one edge of the second substrate and the edge of the second substrate forms a step portion with respect to the first substrate,
   wherein the base substrate has an interlayer groove portion formed at the edge of the second substrate between the first substrate and the second substrate, at least one of the base substrate, the first substrate and the second substrate comprises a pliable resin, and at least one of the base substrate, the first substrate and the second substrate comprises an inorganic filler.

2. The wiring board according to claim 1, wherein:
   the first substrate and second substrate each comprise the pliable resin, and
   the base substrate comprises a resin containing the inorganic filler.

3. The wiring board according to claim 2, wherein the inorganic filler contains one of a silica filler and a glass filler.

4. The wiring board according to claim 1, wherein:
   the base substrate comprises the pliable resin,
   the first substrate comprises one of a resin containing the inorganic filler and a resin-impregnated inorganic fabric, and
   the second substrate comprises one of a resin containing the inorganic filler and a resin-impregnated inorganic fabric.

5. The wiring board according to claim 4, wherein at least one of the first substrate and the second substrate comprises the resin impregnated inorganic fabric, and the resin impregnated inorganic fabric comprises a glass cloth.

6. The wiring board according to claim 1, further comprising a via formed in at least one of the first substrate and the second substrate.

7. The wiring board according to claim 6, further comprising:
   a conductive layer formed on an inner surface of the via by plating; and
   a metal filled in the via.

8. The wiring board according to claim 6, further comprising:
   a conductive layer formed on an inner surface of the via by plating; and
   a resin filled in the via.

9. The wiring board according to claim 1, wherein the interlayer groove portion is filled with at least one of a gas, a liquid and a solid material.

10. The wiring board according to claim 1, further comprising a warping prevention portion formed at the step portion formed by the edge of the second substrate.

11. The wiring board according to claim 1, further comprising an adhesion prevention layer formed on the first substrate, wherein the adhesion prevention layer has an opening at the step portion formed by the edge of the second substrate, and the opening is filled with at least one of a gas, a liquid and a solid material.

12. The wiring board according to claim 1, further comprising:
   a conductive pattern formed on the first substrate; and
   a conductive pattern formed on the second substrate,
   wherein the conductive pattern on the first substrate and the conductive pattern on the second substrate are connected by a through-hole formed through the first substrate and the second substrate.

13. The wiring board according to claim 1, wherein:
   the first substrate is structured with a first lower-layer insulation layer and a first upper-layer insulation layer, and
   the second substrate is structured with a second lower-layer insulation layer and a second upper-layer insulation layer.

14. The wiring board according to claim 13, further comprising:
   an upper conductive pattern formed on each of the upper-layer insulation layers; and
   a lower conductive pattern formed on each of the lower-layer insulation layers,
   wherein the conductive patterns on the upper-layer insulation layers are each connected to a respective conductive pattern on the lower-layer insulation layers through vias.

15. The wiring board according to claim 1, wherein opposing ends of the first substrate are not aligned with an end of the second substrate such that a central portion of the wiring board is thicker than a peripheral portion of the wiring board corresponding to the opposing ends.

16. The wiring board according to claim 1, further comprising a through hole formed through the base substrate and at least one of the first substrate and the second substrate.

17. The wiring board according to claim 1, further comprising a plurality of prevention layers formed in the interlayer groove portion.

18. The wiring board according to claim 1, further comprising a conductive pattern formed on the first substrate and extending into the interlayer groove portion at the step portion formed by the edge of the second substrate.

19. The wiring board according to claim 1, further comprising:
   an adhesion prevention layer formed on the first substrate; and
   a conductive pattern formed on the adhesion prevention layer and extending into the interlayer groove portion at the step portion formed by the edge of the second substrate.

20. The wiring board according to claim 1, wherein the interlayer groove portion is filled with at least one of an elastic material and a viscous material.

21. The wiring board according to claim 1, further comprising a through hole formed through the base substrate, the first substrate and the second substrate.

22. The wiring board according to claim 1, further comprising an adhesion prevention layer formed on the first substrate, wherein the adhesion prevention layer has an opening at the step portion formed by the edge of the second substrate, and the opening is filled with at least one of an elastic material and a viscous material.

23. The wiring board according to claim 1, wherein the inorganic filler contains a silica filler.

24. The wiring board according to claim 1, wherein the inorganic filler contains a glass filler.

25. The wiring board according to claim 1, further comprising a plated through hole formed through the base substrate, the first substrate and the second substrate.

26. The wiring board according to claim 1, further comprising a through hole formed through the base substrate and at least one of the first substrate and the second substrate, wherein the first substrate comprises a plurality of insulation layers, and the second substrate comprises a plurality of insulation layers.

27. The wiring board according to claim 1, wherein:

the base substrate comprises the pliable resin, the first substrate comprises a resin containing the inorganic filler, and the second substrate comprises a resin containing the inorganic filler.

28. The wiring board according to claim 1, wherein the first substrate comprises a plurality of insulation layers, and the second substrate comprises a plurality of insulation layers.

29. The wiring board according to claim 1, wherein the base substrate is made of a resin, the first substrate comprises a plurality of insulation layers, and the second substrate comprises a plurality of insulation layers.

30. The wiring board according to claim 1, wherein the base substrate is made of a resin including the inorganic filler, the first substrate comprises a plurality of insulation layers, and the second substrate comprises a plurality of insulation layers.

* * * * *